United States Patent [19]

Liken et al.

[11] Patent Number: 5,072,177
[45] Date of Patent: Dec. 10, 1991

[54] PRODUCT CARRIER WITH EXTENDED PORT INTERFACE

[75] Inventors: Peter A. Liken, West Olive; Kevin L. Hartwig; Peter A. Martin, both of Holland, all of Mich.

[73] Assignee: Venturedyne, Ltd., Milwaukee, Wis.

[21] Appl. No.: 520,124

[22] Filed: May 8, 1990

Related U.S. Application Data

[63] Continuation of Ser. No. 343,835, Apr. 26, 1989, abandoned.

[51] Int. Cl.[5] ............................................. G01R 1/04
[52] U.S. Cl. ............................. 324/158 F; 324/158 R; 361/415
[58] Field of Search ............... 324/158 F, 158 P, 73.1; 361/413, 412, 415

[56] References Cited
U.S. PATENT DOCUMENTS

| | | | |
|---|---|---|---|
| 4,683,424 | 7/1987 | Cutright et al. | 361/415 |
| 4,777,434 | 10/1988 | Miller et al. | 324/158 F |
| 4,812,758 | 3/1989 | Keel et al. | 324/158 F |

Primary Examiner—Curtis Kuntz
Assistant Examiner—Edward Urban
Attorney, Agent, or Firm—Michael, Best & Friedrich

[57] ABSTRACT

A product carrier and an environmental test chamber are constructed so that the carrier is positioned by sliding it into the chamber. The leading wall of the carrier includes an extended port for electrical connections and which projects in the direction of sliding movement of the carrier. The extended port mates with a junction to an external test control circuit, the junction being carried on a chamber wall in the path of movement of the carrier, but spaced from the test chamber itself. The external junction, being on that wall, is not exposed to the test environment within the chamber.

8 Claims, 2 Drawing Sheets

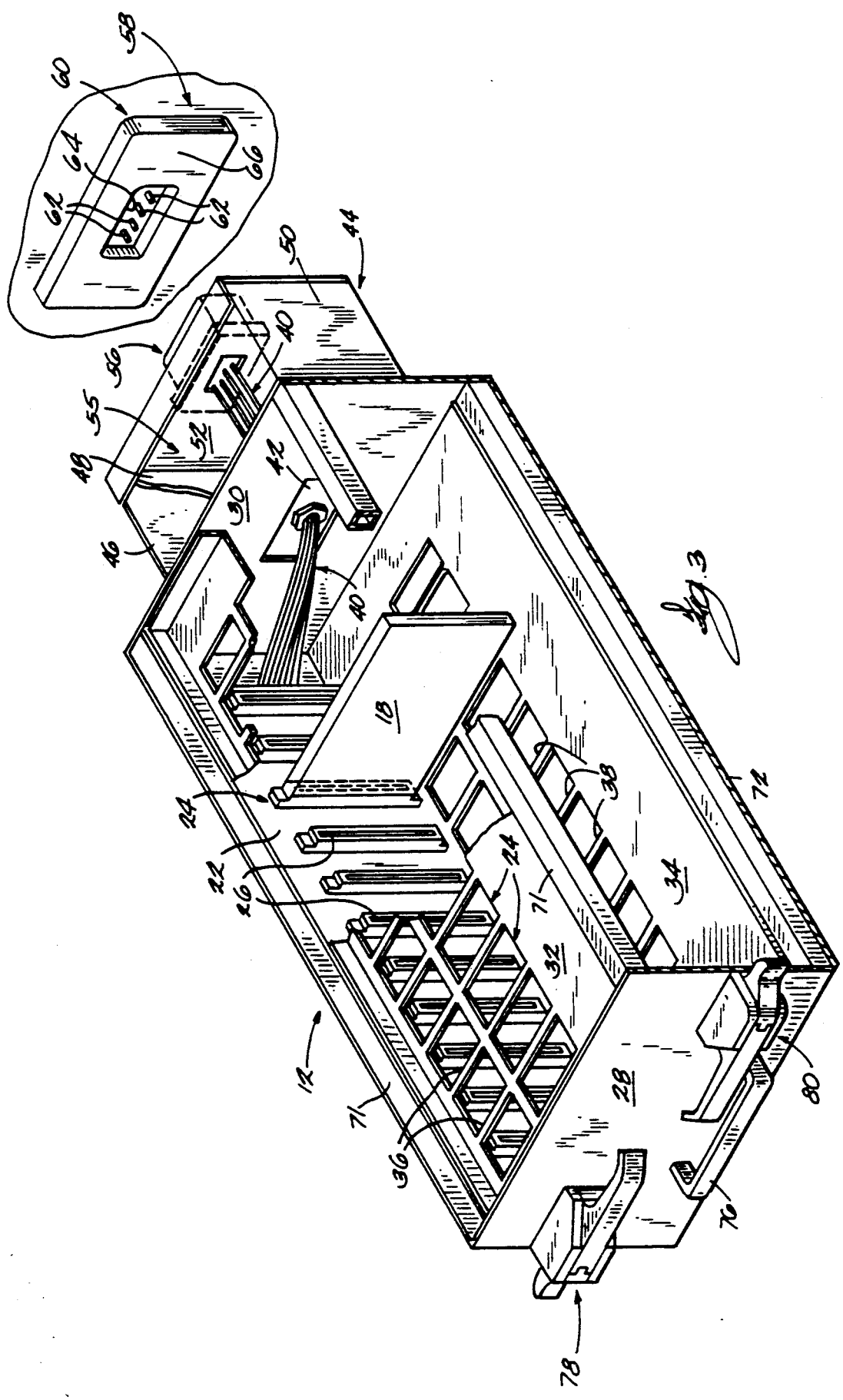

PRODUCT CARRIER WITH EXTENDED PORT INTERFACE

BACKGROUND OF THE INVENTION

This application is a continuation of Ser. No. 07/343,83 filed Apr. 26, 1989, now abandoned.

This invention relates to environmental test chambers and, more particularly, to product carriers for use in such chambers.

A common application for environmental test chambers is to carry on tests on various electronic devices, for example "burn-in" of circuit boards. In such tests, circuit boards or electronic devices (products) are placed in an environmental chamber and cycled through their operational sequences while simultaneously being subjected to varying conditions of temperature, humidity and often shock and/or vibration. These types of product testing and evaluation are common and well known.

One of the problems encountered in connection with these types of chambers is in the transport of the product to the chamber and the connection and set up of the product in the chamber for testing, and changing the test cycle to accommodate different products or different test cycles for the same product. Various arrangements have been proposed for accomplishing the functions of moving product into and out of the test chamber, and for connecting the product electrically and supporting the product physically in the test chamber during testing. An example of one such prior proposal can be found in U.S. Pat. No. 4,683,424, which is assigned to the assignee of this application.

SUMMARY OF THE INVENTION

This invention is similarly concerned with these problems of product transport, connection and set up for testing and has among its general objects to provide an improved product carrier which facilitates those operations in the test chamber.

A more specific object is to reduce the exposure of the environment within the test chamber to the electrical connections necessary for product testing, i.e., exposure to the varying temperature and/or humidity within the chamber.

Another specific object of this invention is to provide ready access to the product's external electrical connections for repair, maintenance, or, if necessary, changes to vary a test cycle.

For the achievement of these and other objects, this invention proposes a product carrier having an extended external terminal port through which the external test circuit connections are made and the combination of that product carrier with a test chamber configured to accommodate the extended port so that the connections to the external test circuit are removed from the test chamber environment. The product carrier includes a support structure which physically orients the product in the chamber and includes an electrical junction arrangement through which the product can be connected to a test circuit. The electrical junction, or junctions, when positioned within the test chamber are connected to an external test circuit which controls the cycling of the product through a preselected test procedure. The electrical circuitry for making the electrical connection to the external connector is incorporated in the product carrier. More specifically, the product carrier is provided with a terminal port which is supported on one of the walls of the carrier. The carrier and test chamber are constructed and arranged such that the carrier is inserted into the chamber by sliding it into the chamber. The leading wall of the carrier is provided with a projecting port, i.e., an extended port, that, as the carrier is moved into its intended position within the chamber, mates with a junction to an external circuit. Because the port extends from the carrier wall, the external junction is not located within the chamber itself, but is physically isolated from it. With this arrangement, the circuit elements running from the individual products are channeled to and through the extended port. This then positions the wiring ends for the individual products in an area which is readily accessible from the exterior of the test chamber. Access can be made to that wiring through the external chamber wall which carries the external junction.

The novel features of this invention are set forth in the appended claims. The invention itself, together with additional objects and advantages thereof, will be more clearly understood from a reading of the following description in connection with the accompanying drawings wherein a preferred embodiment of the invention is disclosed and in which:

DESCRIPTION OF THE DRAWINGS

FIG. 3 is a perspective view of a product carrier having one circuit board assembled in the carrier and showing a portion of an external wall of the chamber having an external electrical plug assembly.

DESCRIPTION OF THE PREFERRED EMBODIMENT

Figure 1:
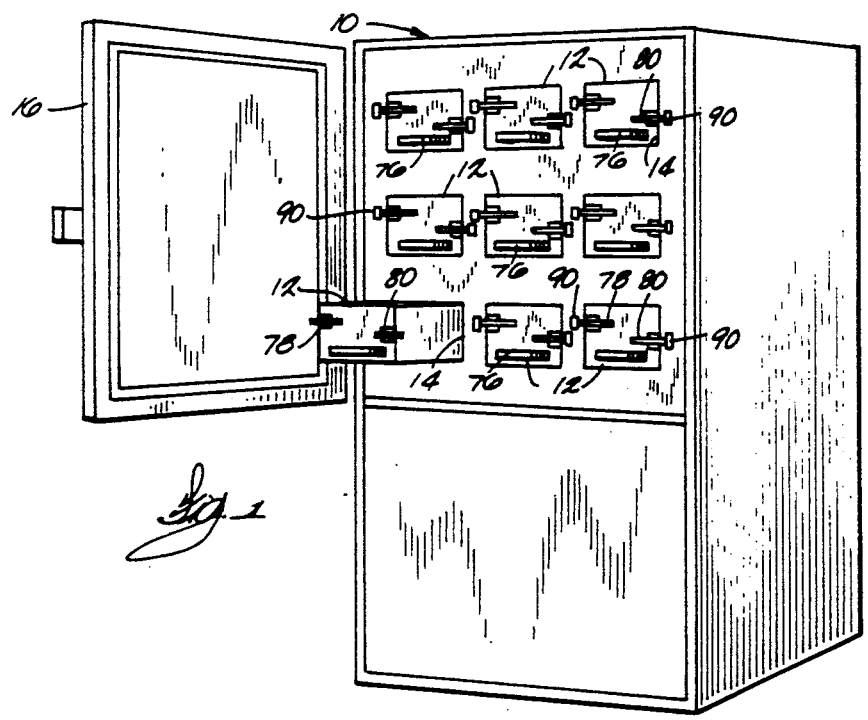
FIG. 1 is a perspective view of a test chamber illustrating several product carriers inserted in a test chamber.

With particular reference to FIG. 1 of the drawing, a test chamber 10 is illustrated as having a plurality of product carriers 12 inserted therein. One such carrier is shown partially withdrawn from the test chamber to illustrate the fact that the carriers are inserted in the test chamber by sliding them through the opening 14. The test chamber can be provided with an outer door 16 to close and secure the interior of the test chamber after the desired product carriers, and product, have been inserted in the chamber.

The test chamber is usually provided with heating, cooling, and/or humidifying mechanisms, and in some instances vibration creating mechanisms. These can be housed in the lower portion of the test chamber, i.e., below opening 14, or in some cases, and with certain mechanisms, external to the chamber. These are conventional, so they have not been illustrated. Similarly, controls for these mechanicals are usually provided and located external to the chamber. Since the controls too are conventional, they have not been illustrated.

Figure 2:
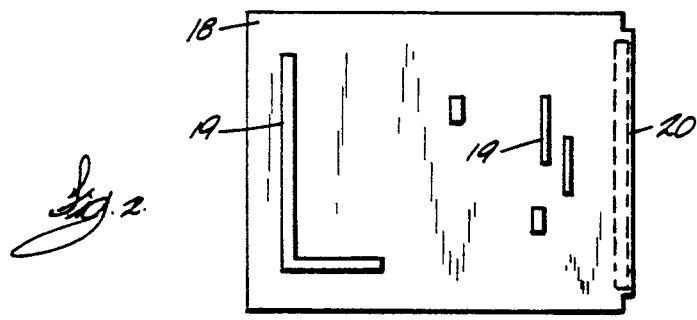
FIG. 2 is a generally schematic illustration of a typical product, in this case a circuit board.

FIG. 2 illustrates a typical product of the type which can be tested in the chamber. In this case, it is an electrical circuit board 18 having conventional circuit elements 19 thereon and an electrical plug 20. The product could as well be any one of a number of electrical components or actual assembled devices such as radios, cellular telephones, electrical instruments or the like.

With reference to FIG. 3, one of the product carriers 12 is illustrated. The product carrier includes a mother board 22 forming a wall extending along one side of carrier. The mother board is provided with a plurality of electrical junctions 24 and each junction includes a female plug 26 for receipt of plug 20 of the circuit boards. For convenience, only one circuit board is illustrated in FIG. 3 so that the interior of the carrier is more visible. In practice, a circuit board 18 would be associated with each of the junctions 24.

To complete the physical structure of the carrier, it includes front and rear panels 28 and 30 and top and bottom panels 32 and 34. The front and rear panels are closed while the top and bottom panels include a plurality of openings 36 in the top and 38 in the bottom for ventilation purposes.

The wires from the junctions 24 are contained in the mother board and extend from the mother board to the rear panel 30, see wire bundle 40 in FIG. 3. The wires 40 extend through a plate 42 into an extended port 44. The extended port is made up of top wall 46, sidewalls 48 and 50, end wall 52 and bottom wall 54 (see FIG. 4) which, together with rear panel 30 of the carrier, form a cube shaped chamber 55. The leads 40 extend into and through the chamber 55. Leads 40 terminate in an electrical junction 56 which projects laterally from wall 52 of the extended port.

A portion 58 of the outer wall of the test chamber 10 is illustrated in FIG. 3. That portion of the outer wall carries an electrical plug assembly 60 configured to mate with the junction 56. Electrical plug 60 consists of conventional electrical terminals 62 located in an opening 64 in rectangular block 66. As can perhaps best be seen in FIG. 4, the rectangular block 66 is connected to a plate 68 which in turn is suitably releasably fastened to the outer chamber wall 58. Electrical connections are made to the terminals 64 through suitable wire connectors, see wire bundle 70 in FIG. 4. Wire bundle 70 provides the incoming circuitry for the test circuit.

Figure 4:
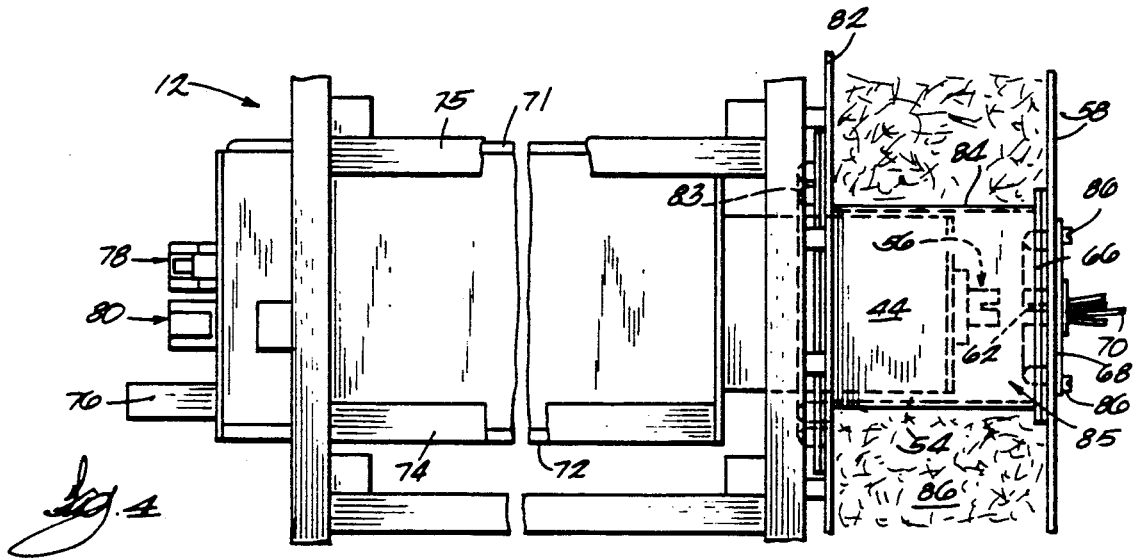
FIG. 4 is a side elevation of a product carrier partially inserted in a test chamber, both carrier and test chamber constructed in accordance with this invention.

With references to FIGS. 3 and 4, the product carrier 12 includes upper slides 71 and 72, one in each of the lower corners of the carrier, only one being visible in FIG. 3 and in FIG. 4. These slides engage an upper pair of horizontally spaced brackets 74 and a lower pair of horizontally spaced brackets 75 within the test chamber, only one bracket on one side of the product carrier in each pair can be seen in FIG. 4, a similar bracket (not shown) is provided on the opposite side.

The above construction attributes a quadrilateral box configuration to the product carrier. The product carrier is positioned with the slides 71 and 72 engaged with brackets 74 and 75. Once so engaged, the product carrier, with the circuit boards assembled therein, slides into the test chamber along the brackets. The brackets 74 and 75 and the slides 71 and 72 relative to junction 56 are positioned such that the junction 56 is aligned with opening 64 and terminals 62. The extended port 44 is positioned on the leading wall 30 of the carrier, that is the leading wall relative to carrier movement into the chamber. With this construction and arrangement, the product carrier, as it is moved into place in the test chamber, moves the junction 56 into electrical engagement with terminals 64. That completes the electrical connection to a suitable test control circuit (connected to wire bundle 70 but not shown) to the mother board and through the mother board to the circuit boards 18.

To facilitate movement of the product carrier into and out of the test chamber, a suitable handle 76 is provided on the front wall 28. Over center latches 78 and 80 are provided on that front wall. The latches cooperate with suitable latch bales 90 on the test chamber walls to securely seat and lock the product carrier in place after the electrical connection has been made between junction 56 and terminals 62.

Referring now specifically to FIG. 4, it will be seen that with the extended port 44 being provided on the leading wall 30 of the product carrier the actual terminal connections to the external terminals 62 are positioned outside of the interior of the test chamber and, therefore, isolated from the conditions which exist within the test chamber. As can be seen in FIG. 4, the outer wall 58 of the test chamber is spaced from the inner wall 82 of the test chamber and a duct 84, rectangular in cross-section, is formed which extends between outer wall 58 and inner wall 82. Duct 84 defines a cube shaped space 85 to receive and accommodate the extended port 44. Gasket rings 83 are arranged between inner wall 82 and the rear panel 30 of the carrier. As the carrier is seated in place in the chamber, gasket rings 83 are compressed between wall 82 and panel 30. This provides a secure seal and prevents any entry of the chamber environment into the extended port. Suitable insulation 86 is included in the space between walls 58 and 82 and around duct 84 in a conventional manner.

Plate 66 is releasably attached to end wall 58 by fasteners 86. With this arrangement, the plate 66 can be removed from the wall 58 to gain access to both the electrical junction 56 and plug 64 without having to remove the product carrier from the test chamber or without major disruption of the environment which has been created within the test chamber. Maintenance and repair can then be conducted on the electrical junction 56 and plug 64 or, if necessary, wiring can be changed to provide for a different test mode.

It should also be noted that with this arrangement, the external connections, junction 56 and terminals 62 are removed from the interior of the test chamber and are therefore basically isolated from the environmental changes which occur within the test chamber. Therefore, the external electrical terminal is not affected by those environmental changes.

Although but one embodiment of the present invention has been illustrated and described, it will be apparent to those skilled in the art that various changes and modifications may be made therein without departing from the spirit of the invention or from the scope of the appended claims.

We claim:

1. A product carrier and test chamber construction comprising, in combination, a product carrier having a framework made up of a plurality of walls, one of said walls including means defining a plurality of junctions for electrical connection to product positioned in said product carrier, a test chamber including an outer wall, means defining an opening in said outer wall, closure means attached to said outer wall at and closing said opening in said outer wall, said closure means including electrical junction means exposed internally of said outer wall, means defining supports within said test chamber for receipt of said product carrier and for guiding said carrier into the test chamber and toward said outer wall of said test chamber, said junction means on said outer wall being aligned with said supports, said product carrier having a wall which is a leading wall in reference to movement of said product carrier into said test chamber, means defining an extension projecting from said leading wall and having an electrical junction spaced from said leading wall, said electrical junction on said leading wall, when said product carrier is engaged with such supports, being aligned with said junction means on said outer wall, said extension extending to said opening in said outer wall and said electrical junction on said extension mating with said junction means, and electrical leads connected to said electrical junctions on said one product carrier wall and extending therefrom through said leading wall to and through said extension to said electrical junction on said extension, so that an external connection is made to products carried by said product carrier through said junction means on said outer test chamber wall.

2. The combination of claim 1 wherein said product carrier has a generally trapezoidal shape formed by a plurality of walls one of which is said leading wall, said extension has a generally trapezoidal shape formed by a plurality of side walls and end walls, one end wall being said leading wall said opening in said outer wall conforms generally to the shape of said extension so that said extension is received within said outer wall opening, and said one end wall isolates said extension on one side of said end wall from the portion of said product carrier on the other side of said end wall and from the interior of said test chamber.

3. The combination of claim 2 wherein said outer wall includes a plate and said junction means on said outer wall is attached to said plate, and including means releasably attaching said plate to said outer wall.

4. The combination of claim 1 wherein said opening in said outer wall is generally elongated in the direction of movement of said product carrier into said test chamber, said extension on said product carrier also being generally elongated and received in said outer wall opening, said outer wall of said test chamber including an outer wall portion and an inner wall portion spaced from said outer wall portion and said outer wall opening extending between said outer and inner wall portions and said junction means being on said outer wall portion, means defining a sealed engagement between said product carrier and said inner wall portion, and electrical connections from said one wall of said product carrier through said leading wall and through said elongated extension on said product carrier to said electrical junction means on said extension.

5. The combination of claim 4 wherein said product carrier has a generally trapezoidal cube shape formed by a plurality of walls one of which is said leading wall, said extension has a generally trapezoidal cube shape formed by a plurality of side walls and end walls, and said opening in said outer wall conforms generally to the cube shape of said extension so that said extension is received within said outer wall opening.

6. The combination of claim 1 wherein said product carrier has a generally trapezoidal cube shape formed by a plurality of walls one of which is said leading wall, said extension has a generally cube shape formed by a plurality of side walls and end walls, and said opening in said outer wall conforms generally to the cube shape of said extension so that said extension is received within said outer wall opening.

7. A product carrier and test chamber construction comprising, in combination, a test chamber including an outer wall, said outer wall including an outer wall portion, an inner wall portion space from said outer wall portion, and an elongated, rectangular in cross-section opening extending between said inner and outer wall portions, means defining electrical junction means on said outer wall portion exposed in said elongated opening, and accessible from the exterior of said outer wall, a product carrier having a framework made up of a plurality of walls, one of said walls including means defining a plurality of electrical connections to a product positioned in said product carrier, guide means within said test chamber for engaging said product carrier and for guiding said product carrier toward said outer wall portion, said electrical junction means on said outer wall portion being aligned with said guide means, said product carrier having a wall which is a leading wall in reference to movement of said product carrier into said test chamber and toward said electrical junction means on said outer wall portion, means defining an extension projecting from said leading wall and receivable in said elongated outer wall opening and having an electrical junction spaced from said leading wall and aligned with said outer wall portion electrical junction means when said product carrier is engaged with said guide means, said leading wall extending over said rectangular in cross-section opening and thereby isolating said extension on one side of said leading wall from the portion of said product carrier on the other side of said leading wall and from the interior of said chamber, and electrical leads connected to said product carrier electrical connections and extending therefrom through said leading wall and said extension to said electrical junction on said extension, so that an external connection is made to products carried by product carrier through said junction means on said outer wall portion which junction means is remote from the interior environment of said test chamber.

8. The combination of claim 7 including means defining a sealed connection between said product carrier and said test chamber inner wall portion.

* * * * *